(12) United States Patent
Bielen et al.

(10) Patent No.: US 8,067,840 B2
(45) Date of Patent: Nov. 29, 2011

(54) POWER AMPLIFIER ASSEMBLY

(75) Inventors: Jeroen A. Bielen, Molenhoek (NL);
Marcus H. Van Kleef, Nijmegen (NL);
Freerk E. Van Straten, Mook (NL)

(73) Assignee: NXP B.V., Eindhoven (NL)

( * ) Notice: Subject to any disclaimer, the term of this patent is extended or adjusted under 35 U.S.C. 154(b) by 475 days.

(21) Appl. No.: 12/305,693

(22) PCT Filed: Jun. 15, 2007

(86) PCT No.: PCT/IB2007/052290
§ 371 (c)(1),
(2), (4) Date: Dec. 19, 2008

(87) PCT Pub. No.: WO2008/007258
PCT Pub. Date: Jan. 17, 2008

(65) Prior Publication Data
US 2010/0059879 A1    Mar. 11, 2010

(30) Foreign Application Priority Data
Jun. 20, 2006   (EP) ..................................... 06115751

(51) Int. Cl.
*H01L 23/52* (2006.01)
*H01L 23/48* (2006.01)
*H01L 29/40* (2006.01)
(52) U.S. Cl. ................ 257/777; 257/E25.017; 257/774; 257/758; 438/108; 438/109; 361/760
(58) Field of Classification Search ........... 257/E23.145, 257/E23.011, E21.597, E25.017, E23.08, 257/712, 762, 765, 771, 774–777, 758; 361/760; 438/108, 109, 629, 637, 688
See application file for complete search history.

(56) References Cited

U.S. PATENT DOCUMENTS

| | | | | |
|---|---|---|---|---|
| 4,751,562 A * | 6/1988 | Yamamura | ..................... | 257/276 |
| 4,959,705 A * | 9/1990 | Lemnios et al. | ............... | 257/532 |
| 5,614,442 A * | 3/1997 | Tserng | ........................... | 438/122 |
| 5,710,459 A | 1/1998 | Teng et al. | | |
| 5,917,209 A * | 6/1999 | Andoh | ........................... | 257/284 |
| 6,112,061 A | 8/2000 | Rapeli | | |
| 6,800,920 B2 * | 10/2004 | Nishijima | ..................... | 257/531 |
| 6,825,559 B2 * | 11/2004 | Mishra et al. | .................. | 257/728 |
| 6,965,837 B2 | 11/2005 | Vintola | | |
| 7,005,721 B2 * | 2/2006 | Nishijima | ..................... | 257/531 |
| 7,012,337 B2 * | 3/2006 | Nogome et al. | ............... | 257/774 |
| 7,608,906 B2 * | 10/2009 | Tennant | ........................ | 257/461 |
| 7,674,719 B2 * | 3/2010 | Li et al. | ......................... | 438/708 |

(Continued)

FOREIGN PATENT DOCUMENTS

EP    1220460 A2    7/2002

(Continued)

*Primary Examiner* — Chris Chu

(57) ABSTRACT

The power amplifier module comprises a laminate substrate comprising thermal vias and terminals, as well as a platform device with an interconnection substrate of a semiconductor material. This substrate is provided with electrical interconnects at a first side, and having been mounted on the laminate substrate with an opposite second side. Electrically conducting connections extend from the first to the second side through the substrate. A power amplifier device is attached to the second side of the substrate. One of the electrically conducting connection through the interconnection substrate is a grounding path for the power amplifier, while a thermal path is provided by the semiconductor material. There is an optimum thickness for the interconnection substrate, at which both a proper grounding and a acceptable thermal dissipation is effected.

12 Claims, 6 Drawing Sheets

U.S. PATENT DOCUMENTS

| | | |
|---|---|---|
| 2002/0036340 A1 | 3/2002 | Matsuo et al. |
| 2002/0081838 A1 | 6/2002 | Bohr |
| 2003/0057534 A1 | 3/2003 | Ho et al. |
| 2004/0173890 A1 | 9/2004 | Moriizumi |
| 2005/0239234 A1* | 10/2005 | Li .................................. 438/109 |
| 2006/0040423 A1 | 2/2006 | Savastibuk |

FOREIGN PATENT DOCUMENTS

| | | |
|---|---|---|
| EP | 06300422.0 A2 | 11/2007 |
| GB | 2325082 | 11/1998 |
| JP | 2002-217650 A | 8/2002 |
| JP | 2004-039864 A | 2/2004 |
| JP | 2005-302873 A | 10/2005 |
| WO | 01/01486 A1 | 1/2001 |
| WO | 0161847 | 8/2001 |
| WO | 2005052599 | 9/2005 |

\* cited by examiner

POWER AMPLIFIER ASSEMBLY

The invention relates to a power amplifier assembly comprising an interconnection substrate suitable for mounting on a carrier with its second side, and a power amplifier device attached to the first side of the interconnection substrate and comprising a first power amplifier.

Such power amplifier assemblies are in use for amplification of signals in a mobile phone, so as to enable the transmittal of a radio-frequent (RF) signal to a base station at a required frequency. The first power amplifier device herein usually comprises several amplification stages, which are in effect separate semiconductor devices. An impedance match is provided between two of said amplification stages. The amplifier device may comprise a further power amplifier, that is designed for another frequency band. An output of the first power amplifier is provided with an output match. The output is further coupled to one or more band switches wherein several receive path transmit paths are merged into a signal line towards an antenna and are nevertheless mutually appropriately isolated. A band pass filter is usually present between the band switch and an output to the antenna. Power control circuitry is present to control the operation of the power amplifier device. This may be a separate integrated circuit, which need not to be part of the assembly.

Such power amplifier assemblies have been studied for many years in order to increase efficiency, to cope with a larger number of frequency bands and to optimize the RF signal transmission. This is exemplified in patents and applications therefore such as U.S. Pat. No. 6,112,061, EP1220460, WO2005052599, U.S. Pat. No. 6,965,837. One important trend herein is the increasing integration of particularly passive components. This allows miniaturization, better RF performance and enables further improvements, such as the use of novel topologies. Recent developments particularly relate to enable tunability of the matching and filtering to a desired frequency. This is carried out in particular with RF MEMS components. Proposals to improve the filtering have been made, for instance by using bulk acoustic wave filters.

In the course of developments for further integration of passive components, it has been found necessary to amend the power amplifier assembly substantially in order to arrive at further improvements. This is the object of this invention.

The object is achieved in a power amplifier assembly of the kind mentioned in the opening paragraph, wherein the interconnection substrate comprises a semiconductor material and is provided with a first electrically conducting connection extending from the first to the second side such that this conducting connection is a grounding path for the first power amplifier, while a thermal path to the second side of the interconnection substrate, hence towards the carrier, is provided by the semiconductor material.

The assembly according to the present invention comprises a semiconductor substrate with vertical interconnects extending from a first to a second side. Particularly, the invention is based on the insight that therewith both thermal and electrical requirements can be met: the electrical requirements are met in the short and therewith adequately controlled ground path, while the semiconductor substrate, particularly a substrate on the basis of Si, is an effective heat spreader.

It is particularly desired that the semiconductor substrate has a heat capacitance that is sufficient to average out any burst in power dissipation in time and space, at least to a certain level. Then, the temperature at the second side of the interconnection substrate, remote from the power amplifier, varies less or only limited, therewith effectively reducing problems relating to differential thermal expansion between the interconnection substrate and the—generally polymer-based—carrier that underlies the interconnection substrate. The spatial distribution of the dissipated power depends on the heat conductivity of the substrate. The temporal distribution depends further on the heat capacity of the substrate. Particularly the averaging in time is relevant for the power amplifier, in view of the operation and large power dissipation in short bursts.

The assembly of the invention provides moreover an improved operation of the power amplifier. The improvement is herein a decrease in the signal distortion and/or an improvement of efficiency, and is enabled by a lower junction temperature. It is due to the improved heat spreading, that the junction temperature of the power amplifier is lowered.

In an advantageous embodiment, the interconnection substrate has a thickness enabling that the first connection has an impedance of at most 30 m$\Omega$. An additionally important feature for the operation of an RF power amplifier is an adequate grounding. If the grounding path is too long, the effective impedance of the ground in the power amplifier deviates substantially from a perfect ground. Moreover, this deviation may be dependent on the exact frequency in use, as well as on the operation temperature. Furthermore, the effective impedance may vary between individual grounding paths. It was observed that an impedance of at most 30 m$\Omega$ is suitable for a proper operation of the power amplifier. Suitably, the impedance is at most 25 nm, and advantageously in the order of 15-20 m$\Omega$. In case of a voltage of 3V and a maximum current per interconnect of 1 A, the losses are 30 mV, which is 1% and thus just acceptable. Moreover, this value is achievable with the assembly implementation according to the invention. If a larger current between a certain position of the amplifier module and ground is needed, it appears appropriate to apply more vertical interconnects.

Suitably, the thickness of the interconnection substrate is in the range of 0.1-0.3 mm. This fulfils requirement and is also mechanically stable. More preferably, the thickness is in the range of 0.12-0.28 mm and even more preferably in the range of 0.17-0.23 mm. This is in particular the case with vias in the interconnection substrate that are made by wet-etching. Such vias have a conical shape and an increasing diameter with increasing distance to the first side of the interconnection substrate.

In a further embodiment, the heat capacity of the interconnection substrate is at least 0.5 mJ/K. This value would be sufficient to store the heat that is dissipated during a single transmission pulse in power amplifier operation. Suitably, the heat capacity is at least 1 mJ/K, and more suitably even larger. Such heat capacity tends to require a surface area of at least 2 mm$^2$ for compliance with transmission with the GSM-standard.

Further embodiments will be discussed afterwards, and include:

the provision of different grounding paths for interstage matching of the power amplifier;

the coupling of the grounding paths on the second side of the interconnection substrate. Such coupling turns out to have good results, without creating an instability in the power amplifier operation and properly manufacturable. It is simultaneously suitable to have such coupled ground near to the power amplifiers, as this reduces undesired variation of ground levels;

the integration of a laminate substrate into the assembly. Such a laminate substrate allows the provision of a standard package outline. It further enables the integration of bigger passive components, particularly inductors.

the integration of passive components into the platform device, the laminate substrate and the power amplifier itself. The allows partitioning of passive components, such that for each specific application the optimal filtering and matching can be achieved;

the definition of a multistage power amplifier as part of the power amplifier device, and suitably an additional power amplifier for another frequency band. The platform device is highly suitable to cope with increasing complexity of power amplifier and related front-end. The requirements to the front end increasingly determine the total performance of the transmission and reception of wireless signals. Such requirement include a good linearity to achieve an adequate efficiency under the constraints of a prescribed level of noise and a minimum distance between amplifier and base station. Moreover, the number of different standards for wireless transmission increases, and users expect that many standards are handled by a single type of equipment. Suitably this is achieved in a single, reconfigurable front end. The platform device of the present invention is suitable both for high-frequency interconnects and passive components as well as a carrier substrate for assembly of further devices. This functionality makes it very suitable for such multiband operation. Moreover, due to the proper thermal dissipation, the junction temperature of a power amplifier may be decreased, allowing higher efficiency.

These and other aspects of the invention will be further elucidated with respect to the Figures that are not drawn to scale and are purely diagrammatical, and in which the same reference numerals in different Figures refer to identical features, in which.

Figure 1:
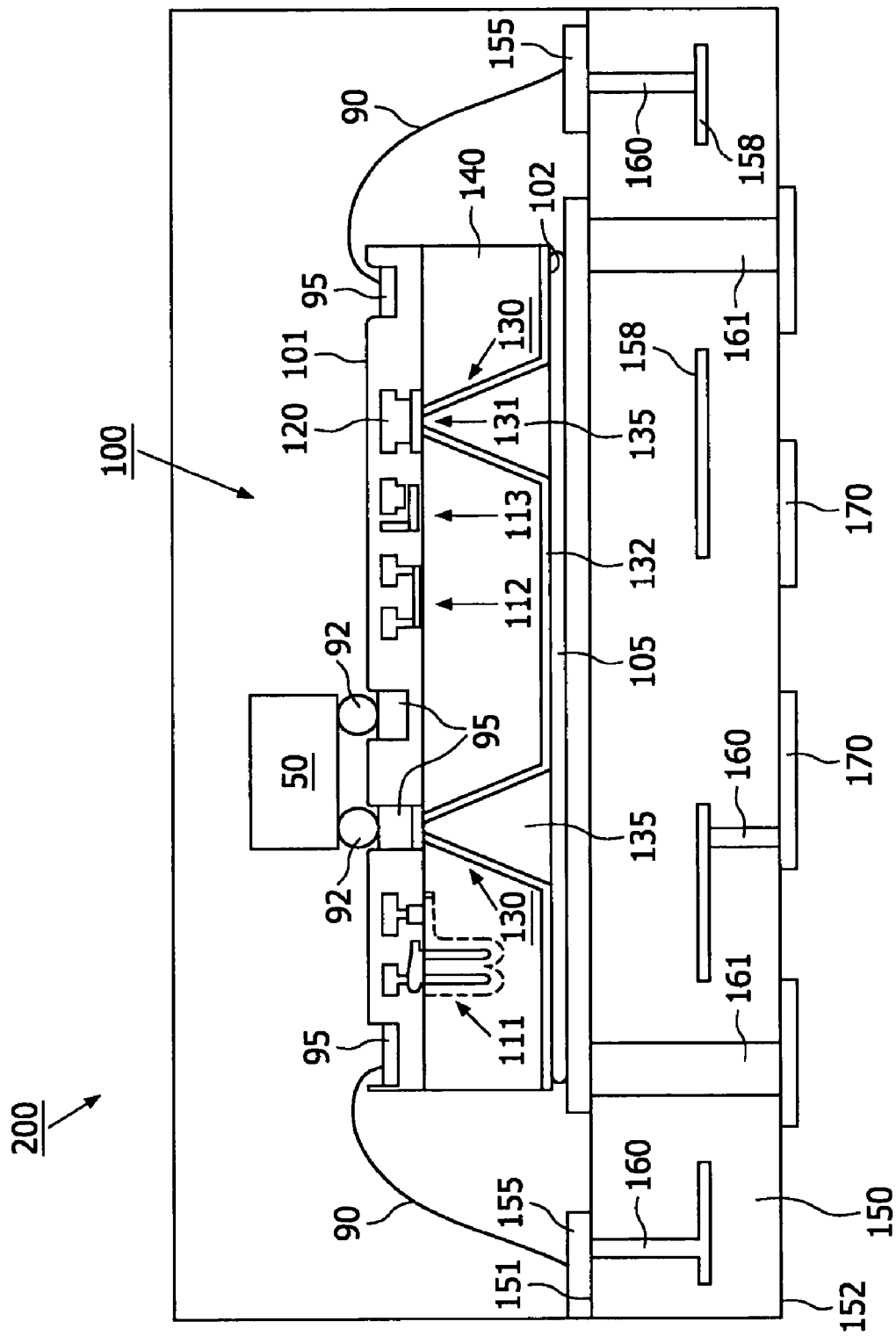
FIG. 1 shows in cross-sectional view the assembly of the invention.

FIG. 1 shows in a cross-sectional view a first embodiment of the assembly 200 with the passive IC 100 of the invention. This passive IC 100 comprises a first side 101 and a second side 102 and is provided with an interconnection substrate 140 of semiconductor material. The substrate 140 comprises vertical interconnects 130 extending from the first side 101 to the second side 102. The passive IC 100 is attached with its second side 102 to a first side 151 of a carrier substrate 150 with an adhesive 105. Bond wires 90 extend from bond pads 95 on the passive IC 100 to corresponding bond pads 155 on the carrier substrate 150. Electrical vertical interconnects 160 extend through the carrier substrate 150 to terminals 170 on a second side 152 of the carrier substrate 150, facing away from the first side 151. Thermal vertical interconnects 161 extend to at least one thermal terminal 171 at the second side. The carrier substrate 150 further contains one or more inductors 158, which are in at least most cases coupled to bond pads 155 on the first side 151.

Passive elements 111-113 have been defined on the first side 101 of the passive IC 100, in addition to interconnects 120 and bond pads 95. Some of those bond pads are provided with bond wires 90 to the carrier substrate 150, while others are provided with solder balls 92 to electrical devices 50 assembled on top of the passive IC 100. It is alternatively possible to provide another connection between any electric device 50 and the passive IC 100, for instance with bond wires, TAB-foil or the like. Examples of electrical devices 50 include a power amplifier, a power control integrated circuit, switches, band pass filters, such as bulk acoustic wave filters, and impedance matching networks, particularly with variable capacitors in the form of MEMS-elements or varactors. It is particularly for the power dissipation if the power amplifier is applied to the platform device 100 with a flip-chip technique. This turns out suitable for the dissipation of heat and for ensuring a low-ohmic connection between the output of the power amplifier and the platform device. In the latter case, use can be made of an array of bumps for the coupling of a single contact to the platform device. It was found, advantageously, that it is possible to assemble a bump on top of a vertical interconnect—also called bump over via—, if said bump over via is part of an array of bumps. It is not adviced to apply an isolated bump on a vertical interconnect due to the mechanical weakness of the interconnect. This is particularly the case with wet-etched vias that are not completely filled with any material.

The substrate 140 of a semiconductor material has a resistivity which has been tuned so as to allow definition of high quality inductors on the substrate 140. Particularly, the resistivity has been increased in at least part of the substrate 140, for instance by implantation of dopants such as Ar, Ne, Nitrogen or through irradiation with for instance c-beam. A suitable resistivity is a resistivity of more than 1 k$\Omega$/.

The construction of the passive IC 100 will be discussed in more detail with reference to its manufacture, see FIGS. 2-4.

Figure 2:
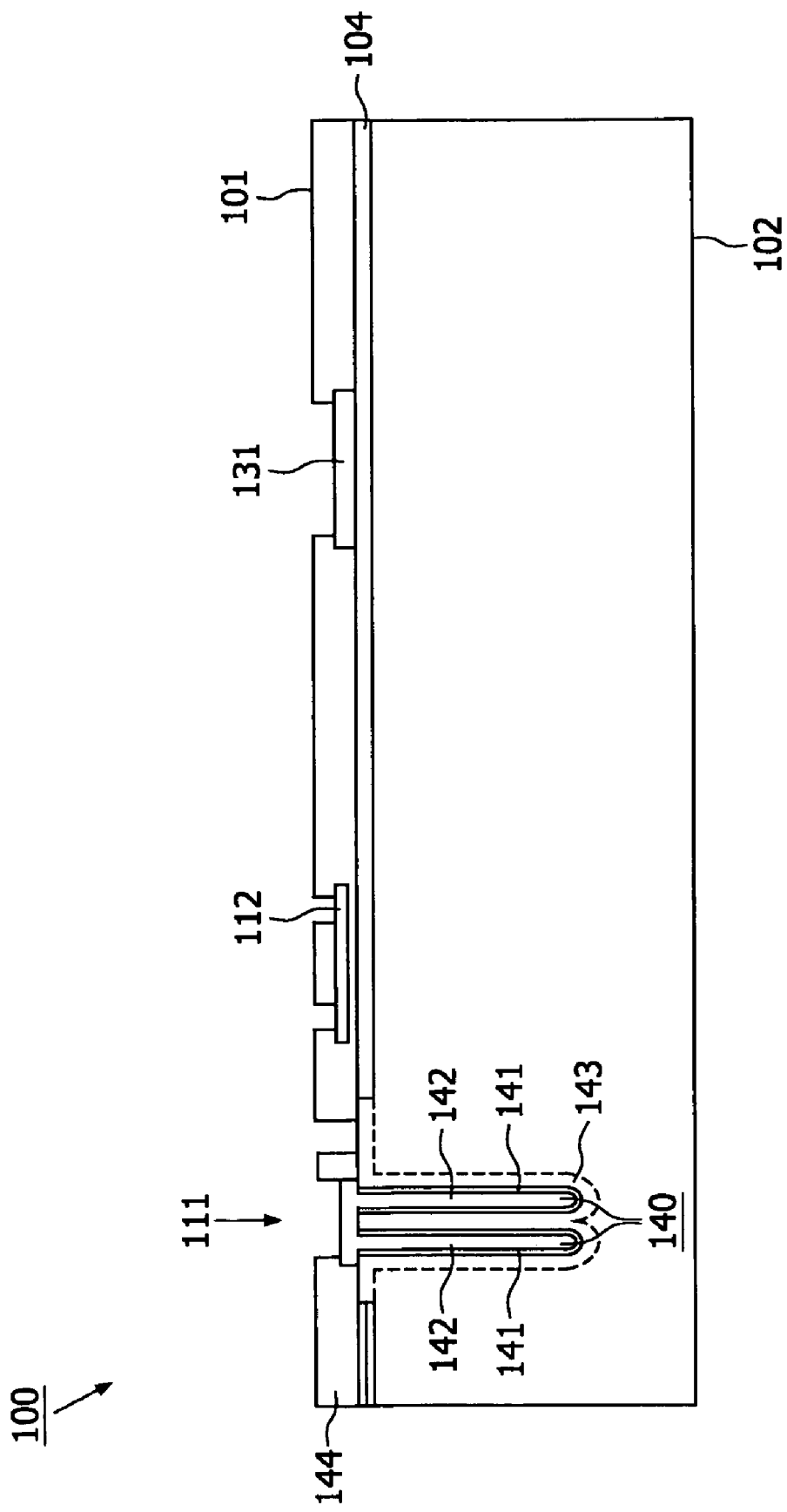
FIGS. 2-4 show in cross-sectional view several stages in the manufacture of the platform device used therein.
Figure 3:
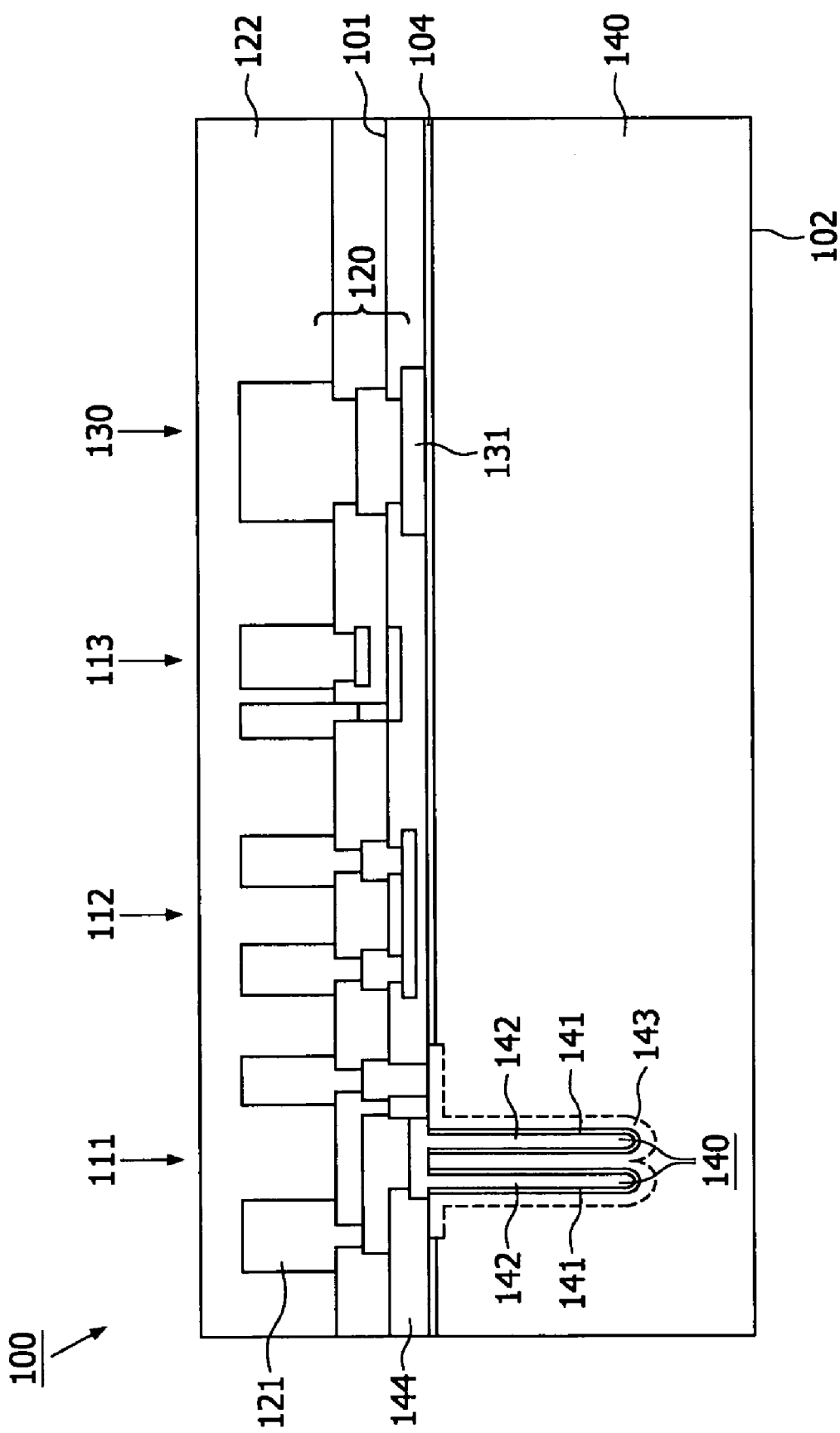
Figure 4:
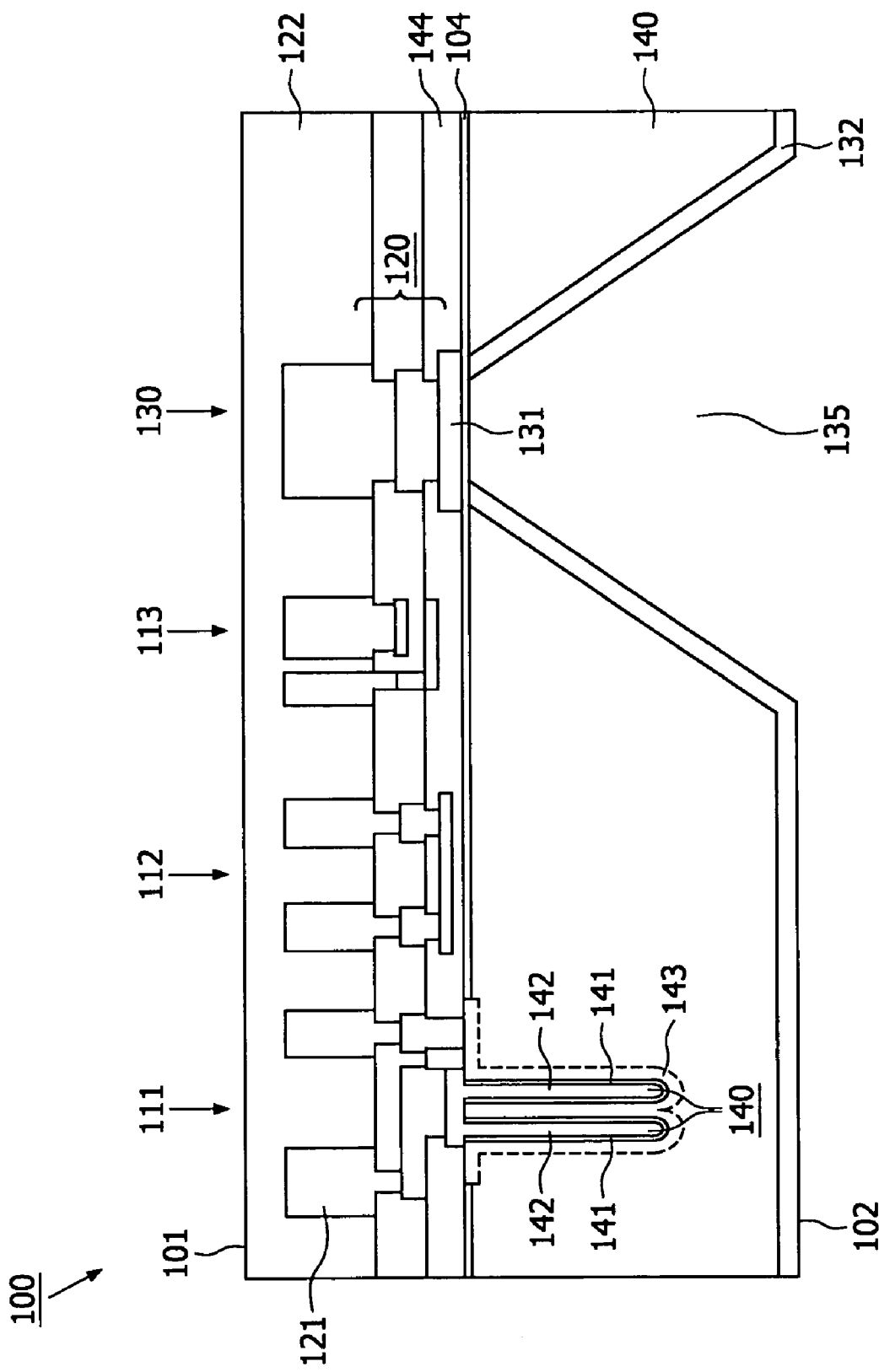

FIGS. 2-4 show the manufacture of the passive IC 100 according to a first embodiment. An insulating layer 104 is defined on the first side 101. Trenches have been etched in the substrate 140 and filled with dielectric material 141 and electrically conductive material 142 to define a capacitor 111. This capacitor 111 has due to its shape a relatively high capacitance density, particularly of 25-100 nF/mm$^2$ or even more. The shape of the trench is open to a design that may be optimized. It could alternatively comprise pillar structures within cavities in the substrate, as has been described in the non-prepublished application PH005852 (EP 06300422.0). The dielectric material suitably comprises a nitride, and most suitably an oxide-nitride-oxide stack. A surface 143 of the trench is doped with electrically conductive particles, in a manner known to the skilled person, in order to function as a capacitor electrode. The conductive material 142 is suitably polysilicon that is doped in known manner. The conductive material 142 is additionally provided at selected areas outside the trench, which is advantageous but not necessary. In this example, some area is used as a resistor 112, while another area is used as a barrier layer 131 that will be part of the vertical interconnect 130 through the interconnection substrate 140. A dielectric material 144 is provided according to a desired pattern, in a manner known to the skilled person, to define contacts to the passive components 111, 112.

FIG. 3 shows the passive IC 100 in a second stage after provision of a metallization structure 120 including electrically conductive and electrically insulating patterns. The metallization structure 120 comprises an additional capacitor 113. This capacitor has a lower capacitance density than the trench capacitor 111, which is often needed in RF applications, while it is defined more precisely, with a better breakdown voltage and with low-ohmic electrodes. The resistor 111 is provided with contacts 111A in a separate layer. The metallization structure 120 has been expanded with a further metal layer 121. This metal layer 121 has a large thickness, i.e. suitably over 1 microns, in order to define inductors that function properly at RF frequencies. Thereto, the thickness must be larger than twice the penetration depth of currents at the frequencies in use. This penetration depth depends on the material of the metal layer 121, which may be a metal such as Al, Cu, Au, an alloy such as Al.Cu, Al.Si, Al.Mg or even doped polysilicon. The metal layer 121 is shown to be covered with a further dielectric layer 122. This further dielectric layer 122 is to be opened or to be removed in order to give access to any bond pads—not shown—in the metal layer 121

FIG. 4 shows a further stage in the manufacture of the passive IC 100. Herein, vertical interconnects 130 are fabricated by wet-chemical etching of through-holes 135 from the second side 102 and subsequent provision of electrically conductive material 132. In the manufacture of the through-holes 135, the etching is brought to an end by an etch stop layer on the front side of the semiconductor substrate 140. This may be a conventional insulating layer 104, such as a nitride or an oxide, but could alternatively be a metal layer.

The electrically conductive material 132 is deposited both on the walls of the etched through-hole 135 and on any exposed metal of the metallization structure 120. Preferably, the through-holes 135 are not filled completely. This prevents that cracks develop in the semiconductor substrate 140 due to differential thermal expansion of the substrate 140 and the metal in the through-hole 135, particularly during thermal cycling or further assembly steps.

This electrically conductive material 132 advantageously comprises a barrier layer, which prevents the formation of undesired alloys between the substrate material (e.g. Si), the exposed metallization structure on top of the vertical interconnect (e.g. Al or Al alloys). It was found in experiments that use of Ti as a barrier layer does not give appropriate results due to reactions between the Al and Si and/or the Ti that are induced by the Ti. Use is made here of a stack of Ni and a further conductive layer, such as silver, aluminum, aluminum alloys, copper, palladium, titanium nitride or gold. Surprisingly, it has been found that the resulting vertical interconnect has a low impedance and does not suffer from magnetic currents within the Ni layer of the interconnect 130.

In Relation to the Heat Spreader Function of the Substrate

According to a first aspect of the invention, the vertical interconnects 130 through the substrate 140 provide a grounding path for a power amplifier assembled on the front side 101, while the substrate 140 operates as a thermal path. Particularly, it has been found that there is an optimum thickness for the interconnection substrate, at which both a proper grounding and an acceptable thermal dissipation is obtained. This optimum thickness is in the range of 100 to 300 micrometer for the case of a silicon substrate with wet-etched through-holes. If the substrate 140 has a smaller thickness than 100 micrometer, the quality factor of any of the inductors on top of the semiconductor substrate 140 decreases below an appropriate level. Additionally, the overall thermal resistance has been found to increase. If the substrate has a larger thickness than 300 micrometer, then the parasitic inductance of the vertical interconnect 130 increases above an acceptable level and the RF grounding performance will degrade. In the case of dry-etched through-holes, the thickness may be as large as 400 micrometers.

It is observed that this optimum thickness is particularly relevant if the substrate has a lateral width that is larger than the effective distribution of heat within the substrate. This is certainly the case with the platform device of the invention.

Moreover, it was found that the use of the platform device 100 according to this first aspect of the invention leads to a lower junction temperature of the RF power amplifier 50 device. Such a lower junction temperature additionally leads to an improved operation of the power amplifier device. The linearity of the power amplifier has been found very sensitive for both the operating temperature and a proper electrical grounding. By using the present construction, both are realized. In fact, in the case of an RF power amplifier on a platform device, the thermal resistance Rth of the assembly is lower than if the amplifier were assembled on the laminate carrier substrate 150 directly. Due to the presence of the platform device 100 with its semiconductor substrate 140, the heat flows much rapidly 'outside'. Therefore, the junction temperature Tj is lower because Tj is a function of the Rth.

This improved heat spreading is due to the fact that a power amplifier is not a component that is continuously operating at maximum power. Its operation can be considered as a series of power bursts, which particularly occur when making connection with a base station and when amplifying signals. Usually, this leads to a large variation in temperature, caused by heating up and cooling down of the amplifier. Now by using the semiconductor substrate as a heat spreader, the temperature is kept relatively constant. The operation as heat spreader is additionally profitable, as generally, the 'steady state' in which the semiconductor substrate 140 of the platform device 100 is completely heated up, hardly occurs. For this reason, transfer of heat from the substrate 140 of the platform device 100 to the laminate carrier substrate 150 is less important). This, evidently, depends also on the communication standard in use and modulation scheme (e.g. GSM, W-CDMA, Bluetooth, etc).

The improved heat spreading does not only contribute to the efficiency of the amplifier, but also prevents that cracks are initiated in the semiconductor substrate due to difference in coefficient of thermal expansion between the substrate and the electrically conducting connections (vias) therein. An additional effect relates to the expansion and contraction of the laminate. The laminate has a Coefficient of Thermal Expansion (CTE) that is different from a semiconductor substrate, which is a known concern in packaging, for instance in Fine pitch Ball Grid Array Packages. It is known that the cooling phase during thermal cycling is most problematic for the stability of the package, in view of the different contraction of laminate as compared to chip. Now, with the invention, there is less cooling, and also less rapid cooling, and the local maximum temperature decreases at the interface of laminate with the semiconductor material. In short, this contributes to reliability in thermal cycling.

The impedance of the vertical interconnect evidently depends on the actual length of the connection. In one embodiment, the interconnect is made by wet-chemical etching from the rear side of the semiconductor substrate and by subsequent metallization of the resulting surface. This wet-etching leads to a cone-shaped through-hole. Any variation in the thickness of the substrate will lead to a deviation of the cross-sectional area of the through-hole—and therewith the interconnect—at the front side of the substrate. It has turned out that particularly the size of this cross-sectional area is relevant for the impedance of the vertical interconnect. When using a substrate thickness in the selected range, and particularly in the preferred range, this deviation of the impedance of the vertical interconnect has negligible impact on the proper functioning of the device.

Suitably, the vertical interconnects do not provide merely a single grounding path to the amplifier, but a plurality of grounding paths. These grounding paths are electrically coupled to different stages in the power amplifier, such as the input and the output and any intermediate stage. The use of a multiple grounding for a RF Power Amplifier (PA) is needed so as to ensure sufficient stability of the amplifier. In RF circuits, an interconnect also has a relevant impedance. Without multiple groundings, a deviation of the ground impedance in one stage (for instance due to the power amplifier operation) would define the ground level in another stage. This introduces uncontrollable artefacts that may disturb an efficient operation of the amplifier. Moreover, such coupled grounding might function as an additional feedback, and the creation of a cycle within the amplifier, in which an amplified current would be fed back to the input of the amplifier. This is undesired, as it may cause breakdown.

Now, according to the invention, it has been found that the impedance of a path from an front side's end of a vertical interconnect to that of a neighboring vertical interconnect is sufficient to make the grounding independent from each other from an RF perspective. This is also the case, when the metallization of the vertical interconnects extends on substantially the complete second side 102 of the vertical interconnection substrate 140, (e.g. the metallization on the second side 102 is unpatterned). This absence of patterning is moreover advantageous, in that the metallization tends to improve the heat transfer from the semiconductor substrate to the adhesive between the platform device 100 and the carrier substrate 150.

In Relation to the Passive Components

The platform device 100 comprises different types of inductors and capacitors, and additionally resistors. Each type inductor and capacitor has its own properties, which may be exploited for different functional elements in the RF design of the platform device:

trench capacitors have a high capacitance density (particularly about 10 $nF/mm^2$, suitably above 20 $nF/mm^2$) with a relative breakdown voltage. These are useful for decoupling applications a planar capacitor, with a top electrode in an intermediate metallization layer. This contributes to a precise definition of the capacitor. Its capacitance density is suitably between 100 and 200 $pF/mm^2$. It is constructed as patented in WO2001061847. This capacitor is highly suitable for RF applications.

an inductor in the bottom metal layer; this inductor has the advantage of a relatively high resolution patterning, enabling the provision of many turns. However, the thickness of the metal layer is relatively limited (for instance in the order of 0.2-0.6 microns), so that the quality factor is limited. This inductor is for instance suitable for RF choke applications an inductor in the top metal layer; this inductor has the advantage of a relatively high quality factor, as the thickness is chosen to be more than twice the penetration depth of currents at relevant high frequencies between 0.8 and 2.5 GHz. This inductor has furthermore the advantage that it may be defined as a portion of an interconnect line. Suitably, such inductor is provided in a U-shape. It is defined in the same layer as the bond pads an inductor in the intermediate metal layer (thickness about 1 micrometer).

Thanks to this plurality of available types of passive elements and the availability of multiple grounding with vertical interconnects extending through the substrate, the platform device enables the replacement of all discrete elements. This additionally enables a functionality increase without a size increase of the power amplifier module.

The platform device is particularly a power amplifier device, since a power amplifier uses high powers (for instance more than 3 W), which is much more than many other devices, such as transceivers, displays and the like. Moreover, the impedance matching that is needed for the power amplifier and at the antenna requires a plurality of passive components of substantial dimensions. Furthermore, the platform device allows the provision of amplifiers and impedance matching for more than one frequency band.

In Relation to the Power Amplifier

The power amplifier is particularly designed to be suitable for RF applications, such as frequency bands above 900 MHz up to 3 GHz. This frequency spectrum includes GSM, CDMA, W-LAN, WiMAX, 802.11 and other communication standards. Non-linearities of the signal amplification lead here very rapidly to the provision of noise or a substantial decrease in efficiency.

The power amplifier can be placed in a flip-chip arrangement on the interconnection substrate. This enables a linear connection form ground to PA, with minimal losses.

The power amplifier is for instance embodied in a SiGe technology, such as Qubic. The power supply and ground routing on the power amplifier device can be advantageously lay-outed in order to improve the power and ground performance by a good distribution (for instance, a star connection). The improvement is then on the lay-out side the other improvement is in the via holes themselves: they can be designed so that they improve both the ground inductance and the thermal transfer (by using copper for instance in the via)

One may provide several amplifiers on the platform device. Such a construction is suitably for multi-band power amplifier modules.

Use of solder balls with a smaller pitch between the power amplifier and the interconnection substrate. This is enabled as there is no difference between the CTEs of both components. The result is miniaturization.

In Relation to the Platform Device

In one embodiment, the platform device defines a circuit element leading from an input to the power amplifier up to an output to an antenna, with the exception of certain specific functions therein.

The power amplifier usually includes a plurality of stages, in this example three stages. Interstage impedance matching is carried out between the stages of the power amplifier. After the final amplification stage, the signal passes an output match, an antenna switch, a low-pass filter and an impedance matching network. The antenna switch enables switching between the transmit and the receive bands. A further interconnect is present between the antenna switch and an output to a low noise amplifier for amplication of the received signal. The low pass filter and the impedance matching network are in this example integrated into a single functional block. If the platform device is suitable for the processing of signals in more than one frequency band, a band switch is provided additionally. Particularly, such band switch is present between the power amplifiers and the antenna switch.

The interstage impedance matching comprises an LC-network, wherein the capacitors are connected in the signal line, while the inductor is coupled between the signal line and ground. In a suitable example, such LC-network comprises three inductors and two capacitors.

In the present assembly, capacitors and inductors may be defined in the power amplifier device, on the platform device and in the carrier substrate. In a suitable embodiment, at least one of the inductors of the interstage matching is provided on the platform device. This appears advantageous so as to minimize the size of the power amplifier device. In the embodiment that the power amplifier is assembled to the platform device in a flip-chip orientation, e.g. with solder bumps, the inductor is suitably defined in an area facing the power amplifier device. This is allowed, as the inductor operates as an RF choke, for which the quality factor is not highly relevant. In order to minimize noise, the power amplifier device is designed so as that an area overlapping with said inductors is kept free of sensitive components, The capacitors of the interstage matching are however provided in the power amplifier device. As the power amplifier device is defined with a higher resolution than the platform device, the capacitor in the amplifier device may be provided with a relatively high capacitance density. Moreover, integration of the capacitor in the power amplifier reduces the length of the interconnects to the capacitor, and therewith any parasitic inductance.

The situation is different for the output matching. The impedance in the power amplifier is rather low, particularly only a couple of ohms, while the standard impedance level in RF applications is defined as 50Ω. The output match here enables the transformation. Due to the size requirements, the transformation is preferably carried out in the carrier substrate. This additionally allows the use of inductors with coupled windings on top of each other. Thereto, the interconnect on the platform device from the output of the amplifier to the output match is defined as a very low-ohmic interconnect. Thereto, the connection of the amplifier to the platform device is made with a plurality of solder bumps. The interconnect is given sufficient width, while a grounded metal face on the rear side of the platform device provides the interconnect with a stripline character. The connection to the carrier substrate is enabled with bond wires.

For the low pass filter, one requires to have low losses and to prevent any parasitic coupling through the substrate. Additionally, the specified tolerances are low. It has turned out, that the parasitic coupling occurs primarily in a direction normal to the substrate. This coupling is caused by a magnetic field, while an electrostatic field is at least substantially absent. The sources for such parasitic coupling are any bond wires between carrier substrate and platform device, as well as vertical interconnects through the substrate. In order to improve the low pass filter, the inductor is defined in the platform device, while any bond wires are absent between the antenna switch and the output to the antenna.

While this example shows the provision of inductors in the carrier substrate 150, the inductors may be defined in a separate device so as to reduce the complexity of the carrier substrate 150. In that case, a leadframe, could be used instead of a laminate as the carrier substrate 150. The separate device is for instance a metal layer that is integrated in an encapsulating mould, as is known per se from WO-A 2003/85729.

Suitably, the platform device enables the processing of signals from at least two separate frequency bands. In this case, the power amplifier device and a power control device may be designed so as to operate for both frequencies. Particularly, the power amplifier device then comprises a first section for the first band and a second section for the second band, which sections are independent and free of any mutual connection. Interconnects for power control signals are suitably defined in an area on the platform device between both sections. An isolation area is defined in the power amplifier device between the sections for the different frequency bands. The power control interconnects on the platform device may then extend below this isolation area.

In Relation to the ESD Protection of the Passives

In order to protect the platform device against electrostatic discharge pulses that may occur during assembly, it comprises a specific protection. Particularly small capacitors in the platform device are highly sensitive to ESD pulses. Such capacitors may be implemented as planar capacitors, but alternatively as trench capacitors in the substrate. Integration of diodes or other active elements in the platform device is difficult. Crosstalk between individual active elements readily occurs due to the high resistivity of the substrate, unless specific shielding of the elements is implemented.

According to this aspect of the invention, the capacitor is ESD-protected through a resistor between the capacitor output and a ground connection within the platform device, which resistor has a resistance value that is sufficiently high so as to prevent any substantial influence on the RF grounding. Due to the choice of the resistor, there is no DC voltage over the resistor during use of the platform device. If needed, an additional capacitor can be connected in series with the resistance. The term 'capacitor output' is used herein to define the output that is connected to ground after finalization of the assembly.

The reduction of the ESD peak is substantial. The reduction of peak voltage is fourfold for a 50V ESD pulse—from 80 to 20 V—, as given in accordance with the Machine Model. The reduction of peak voltage is even much more for a 300 V ESD pulse, as given in accordance with the Human Body Model. Without resistor, peak voltages above 200 V were found. The peak voltage remained in a time frame of far more than 200 ns. With the resistor, the peak voltage was less than 20 V, and dissipation started already after 10 ns.

It has been found that this coupling between an internal ground and an external ground has marginal influence on the RF behavior of the platform device. The ground impedance is slightly higher at 900 MHz (1.5 vs 1.1. ohm impedance value). The coupling between internal and external ground increases with the frequency, and is at 1 GHz about −50 dB and at 3.0 GHz less than −30 dB. These are acceptable levels of coupling.

Suitably, the resistance value of the ESD protection is at least ten times as large as the impedance of the connection from the bond pad to external ground. In the case of a bond wire, such connection impedance is for instance 6Ω at a frequency of about 2 GHz. The resistance value is then suitably larger than 60Ω, for instance up to 200Ω.

The ESD resistor should be designed to allow the flow of a peak current following an ESD pulse through it. In case that the ESD resistor is aimed at the prevention of damage of an ESD event during assembly or prior to assembly, the voltages of an ESD pulse and the following current are relatively low, and a resistor in doped polysilicon is adequate, while a resistor of TiWN is one of the available alternatives. If one desires to improve an ESD-protection level from 2 kV to 4 kV, the resistor should be designed for a peak current of 3 A.

This ESD protection is particularly suitable for platform devices as discussed in the present application. In such platform devices for RF power applications, the input stage cannot be decoupled and grounded via the normal ground, as this would introduce too much coupling between input and output, which leads to instabilities. It is however not limited thereto, and may be used with benefits for any device comprising ESD-sensitive devices, such as in particular trench capacitors.

EMBODIMENT

A platform device 100 as diagrammatically shown with reference to FIGS. 2-4 was used for experiments. Vertical interconnects having an area at the first side 101 of the substrate 140 of 5*5 microns were provided on a 0.6 mm pitch. The vertical interconnects were made of copper, and the substrate 140 has a thickness of 0.2 mm.

The platform device 100 was assembled to a carrier 150, a multilayer laminate with internal thermal vias and inductors, and tested in simulations. In a comparison between a wirebonded power amplifier, and a power amplifier device provided with a flip chip technique, it was found that the assembly with the flip-chipped power amplifier and the carrier performs much better than that of the wirebonded power amplifier.

Figure 5:
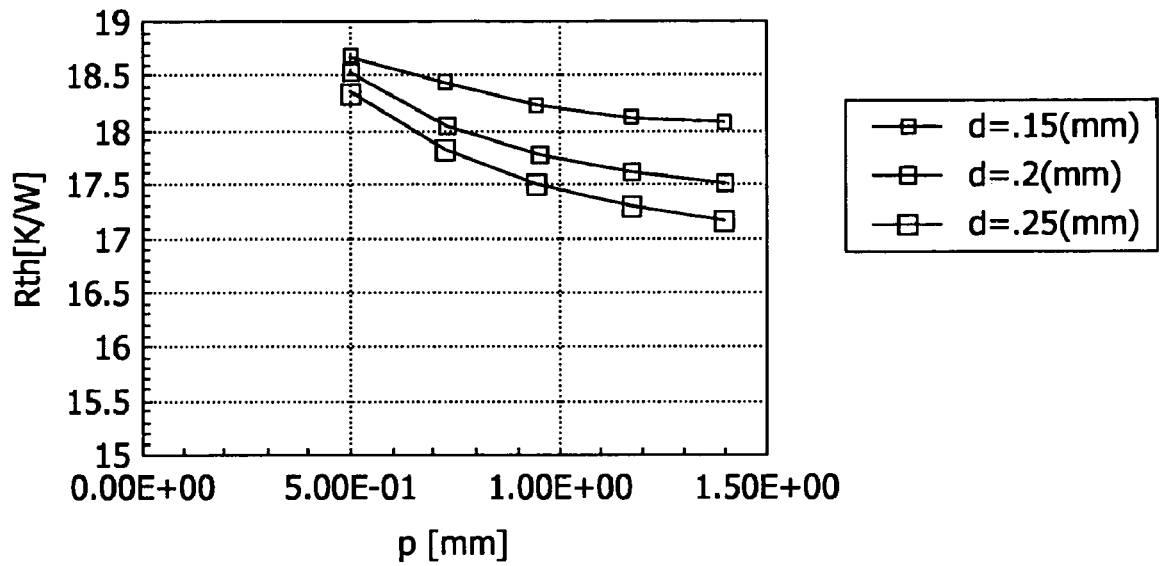
FIGS. 5-7 show graphs with relevant thermal properties of the interconnection substrate.

FIG. 5 shows the thermal resistance Rth as a function of the pitch P between individual vertical interconnects 130. The Figure shows several lines that relate to different thicknesses d of the substrate 140. The thicknesses d are 0.15 mm, 0.20 mm and 0.25 mm for the lines shown from top to bottom. The Figure shows that the thermal resistance decreases with increasing pitch. This is according to the expectation, since the vias are not as capable of heat conductivity as is the semiconductor substrate. The Figure furthermore shows that the thermal resistance generally decreases with increasing thickness. While the thickness does not have a substantial impact with a pitch in the order of 0.5 mm, its impact is in the order of 6% for a pitch in the order of 1.4 mm for a thickness of 0.25 mm in comparison to a thickness of 0.15 mm.

Test were also done to define alignment of the vertical interconnects 130 with respect to the amplifier. The local effect on the junction temperature is evident from the results. It is therefore advantageous that the vertical interconnects 130 are out of alignment with a center of the end stage of a power amplifier. In a preferred embodiment, the vertical interconnects 130 are aligned with edges or corners of the final stage of the power amplifier in the power amplifier device.

Figure 6:
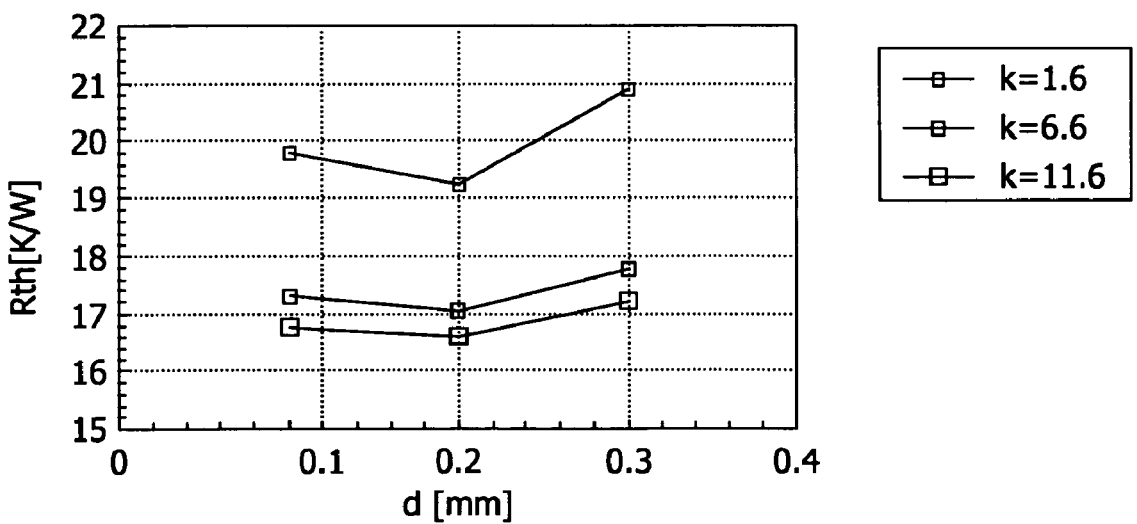

FIG. 6 shows the thermal resistance Rth as a function of the thickness d of the interconnection substrate 140, for an assembly including a laminate carrier 150 attached to the second side 102 of the platform device 100. Experiments were done with a pitch of 0.6 mm between the individual vertical interconnects, and for different die attach adhesives applied between the platform device 100 and the laminate carrier 150. It is found that the heatspreading function improves with the thickness of the substrate 140. This improved heatspreading reduces the thermal resistance of the laminate carrier and the adhesive between the interconnection substrate and the laminate carrier. However, when the thickness of the interconnection substrate further increases, the contact area of the adhesive dramatically decreases due to the shape of the vertical interconnects: there is an optimum thickness around 0.2 mm. The three lines show the results for die attach adhesives with different thermal conductivity. The upper line shows an adhesive with a conductivity k of 1.6 W/m·K, the middle line 6.6 W/m·K and the lower line 11.6 W/m·K. Clearly, the thermal resistance of the adhesive with a high thermal conductivity (11.6 W/mK) is nearly the same as that of the adhesive with an average thermal conductivity (6.6 W/mK). This implies that the die attach is not anymore a limiting factor in heat dissipation, if its value is at least 6 W/mK.

Figure 7:
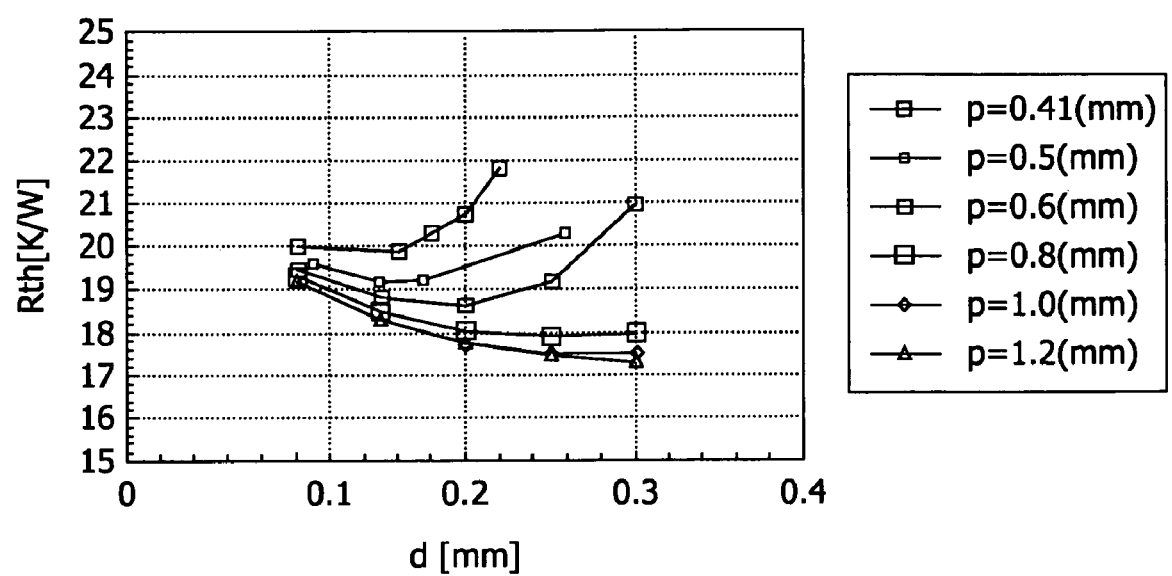

FIG. 7 shows the thermal resistance Rth as a function of the thickness d of the interconnection substrate and the pitch P between the vertical interconnects. As the size of the interconnection substrate is set, the pitch P between the vertical interconnects determines the number thereof. It can be observed from the Figure that with a thickness d between 0.1 and 0.2 mm, the optimum pitch is in the range of 0.6-1.2 mm. Surprisingly, the thermal behavior within this range is substantially flat.

The invention claimed is:

1. A power amplifier assembly comprising:
   a platform device provided with a first and a second side, which comprises an interconnection substrate of semiconductor material and is suitable for mounting on a carrier with its second side, a first electrically conducting connection extending from the first to the second side of the device through the interconnection substrate,
   a power amplifier device attached to the first side of the platform device and comprising a first power amplifier;
   wherein
   the first electrically conducting connection through the interconnection substrate is a grounding path for the first power amplifier, while a thermal path is provided by the semiconductor material of the substrate.

2. A power amplifier assembly as claimed in claim 1, wherein the interconnection substrate has a thickness enabling that the first connection has a resistance of at most 30 mΩ.

3. A power amplifier assembly as claimed in claim 1, wherein the interconnection substrate has a heat capacity of at least 0.5 mJ/K.

4. A power amplifier assembly as claimed in any of the previous claims, wherein the thickness of the interconnection substrate is in the range of 0.12-0.28 mm.

5. A power amplifier assembly as claimed in claim 1, wherein the first power amplifier has a first and a second stage, both of which are provided with an individual grounding path.

6. A power amplifier assembly as claimed in claim 1, wherein the individual ground paths of the amplifier are coupled electrically on the second side of the platform device.

7. A power amplifier assembly as claimed in claim 1, wherein the carrier is part of the assembly and comprises contact pads for coupling the assembly to an external carrier or component, while electrical connections extending from the carrier to the platform device.

8. A power amplifier assembly as claimed in claim 7, wherein said electrical connections comprise signal connections extending from the carrier to the first side of the platform device.

9. A power amplifier assembly as claimed in claim 7, wherein the carrier is a laminate substrate.

10. A power amplifier assembly as claimed in claim 1, wherein the power amplifier device is attached to the platform device with a flip-chip assembly technique.

11. A power amplifier assembly as claimed in claim 1, wherein the platform device comprises at least one interconnect on the first side to connect an output of the power amplifier device to an input of a further device present in the interconnection substrate or assembled thereto.

12. A power amplifier device assembly as claimed in claim 1, wherein the platform device further comprises passive components that are part of one or more matching circuits.

* * * * *